United States Patent [19]
Littlefield

[11] Patent Number: 6,028,456
[45] Date of Patent: Feb. 22, 2000

[54] DUAL-THRESHOLD COMPARATOR CIRCUIT UTILIZING A SINGLE INPUT PIN

[75] Inventor: Troy J. Littlefield, Colorado Springs, Colo.

[73] Assignee: Toko, Inc., Japan

[21] Appl. No.: 09/136,490

[22] Filed: Aug. 18, 1998

[51] Int. Cl.[7] .......................... H03K 5/153; H03K 5/22
[52] U.S. Cl. .................. 327/74; 327/75; 327/87
[58] Field of Search .................. 327/74, 75, 87

[56] References Cited

U.S. PATENT DOCUMENTS

| | | | |
|---|---|---|---|
| 4,559,522 | 12/1985 | Sekino et al. .......................... | 327/75 |
| 4,952,821 | 8/1990 | Kokubun .................................. | 327/74 |
| 5,175,451 | 12/1992 | Ihara ....................................... | 327/87 |
| 5,302,869 | 4/1994 | Hosotani et al. ........................ | 327/74 |
| 5,420,530 | 5/1995 | Mita ........................................ | 327/74 |
| 5,497,117 | 3/1996 | Nakajima et al. ...................... | 327/74 |
| 5,548,227 | 8/1996 | Minami .................................. | 327/87 |
| 5,764,703 | 12/1994 | Charvin et al. ......................... | 327/87 |
| 5,804,995 | 4/1997 | Knuth et al. ............................ | 327/74 |

FOREIGN PATENT DOCUMENTS

| | | | |
|---|---|---|---|
| 359073720 | 4/1984 | Japan .................................... | 327/75 |
| 362100666 | 5/1987 | Japan .................................... | 327/75 |

OTHER PUBLICATIONS

P.Abramson and T.E. Stammely, Protective Circuit, IBM Technical Disclosure Bulletin, vol.26, No. 10A, Mar. 1984.

*Primary Examiner*—Peter S. Wong
*Assistant Examiner*—Pia Tibbits
*Attorney, Agent, or Firm*—William E. Hein

[57] ABSTRACT

A dual-threshold voltage comparator circuit utilizes a single input pin of an integrated circuit and an external resistor network. Appropriate selection of the resistors comprising the resistor network permits independent setting of the dual thresholds of the comparator.

11 Claims, 7 Drawing Sheets

DUAL-THRESHOLD COMPARATOR CIRCUIT UTILIZING A SINGLE INPUT PIN

BACKGROUND AND SUMMARY OF THE INVENTION

This invention relates generally to voltage comparator circuits and, more particularly, to a dual-threshold voltage comparator circuit that utilizes a single input pin.

In many battery-powered applications, a monitoring circuit is used to monitor the voltage of the discharging battery. Typically, the monitoring circuit will generate a Low Battery Indicator (LBI) signal when the battery voltage drops below a certain threshold. Due to varying loading and battery chemistries among different applications, it is not uncommon to resistively divide and compare the battery voltage to a fixed reference, as illustrated in the prior art circuit of FIG. 1. Such an arrangement allows the precise voltage threshold of the LBI signal to be set by properly selecting the ratio of the resistor divider.

In some applications, a secondary indicator is desirable to indicate when a dead battery condition exists. Certain rechargeable battery chemistries can be permanently damaged if allowed to discharge excessively. The generation of a Dead Battery Indicator (DBI) signal can be used to shut down a system and prevent further current draw from the battery. One known method for generating the DBI signal is to create a comparator circuit secondary to the LBI comparator using an additional resistor divider and input: pin, as illustrated in the circuit of FIG. 2. This prior circuit is disadvantageous in that it requires an additional input pin and a resistive divider, which add to the cost of the system.

An alternative approach for generating both the LBI and DBI signals utilizing a single input pin is illustrated in the prior art circuit of FIG. 3. The resistor ratio (R1/R2) is properly selected to set the threshold of the Low Battery Indicator signal. The threshold of the Dead Battery Indicator signal tends to track to the threshold of the LBI signal with a scaling factor that is dependent on the ratio of the reference voltages $V_{REF1}$ and $V_{REF2}$. Since the reference voltages $V_{REF1}$ and $V_{REF2}$ are generally fixed, this approach requires that the threshold of the DBI signal be a fixed percentage of the threshold of the LBI signal. Due to varying requirements of different applications, this prior art approach is undesirable.

It would be advantageous to provide a dual-threshold comparator circuit in which the thresholds of the LBI and DBI signals can be independently set using a single input pin and a single resistive divider.

DESCRIPTION OF THE PREFERRED EMBODIMENTS

Figure 1:
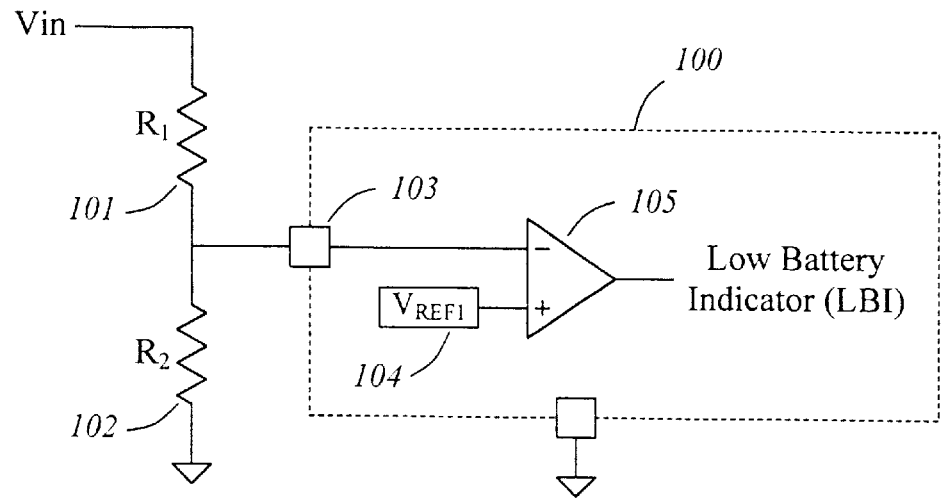
FIG. 1 is a schematic block diagram of a typical prior art voltage comparator utilizing a single input pin and a single threshold level.
Figure 2:
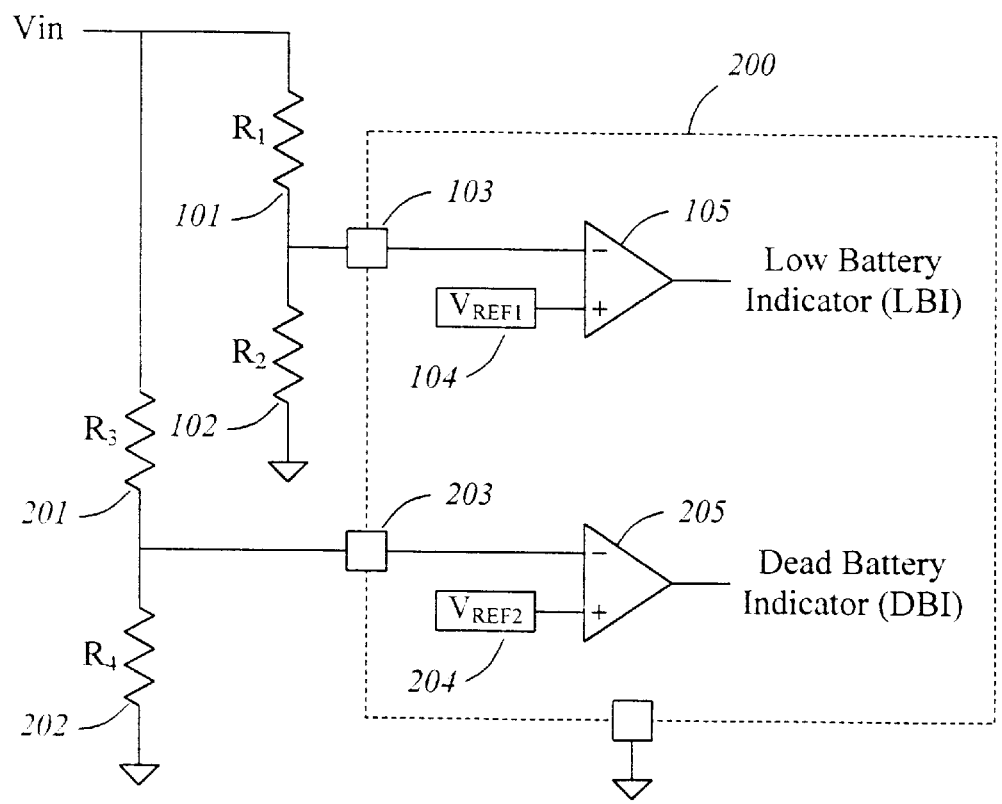
FIG. 2 is a schematic block diagram of a prior art dual-input dual-threshold voltage comparator.
Figure 3:
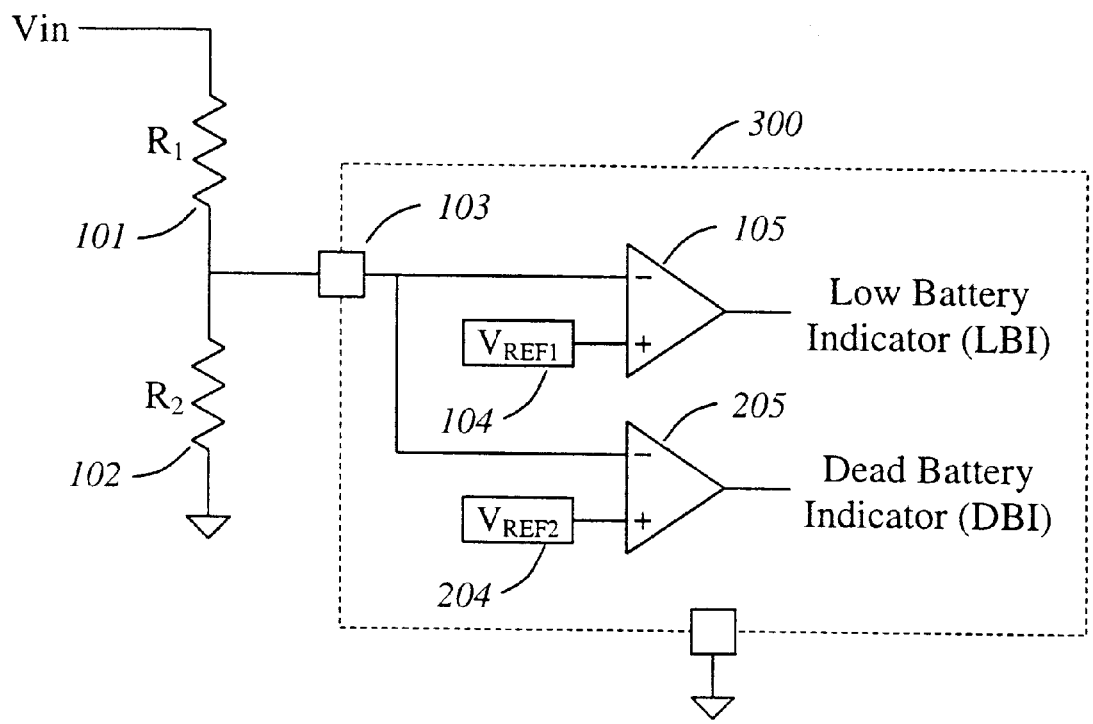
FIG. 3 is a schematic block diagram of a prior art single-input dual-threshold volage comparator.
Figure 4A:
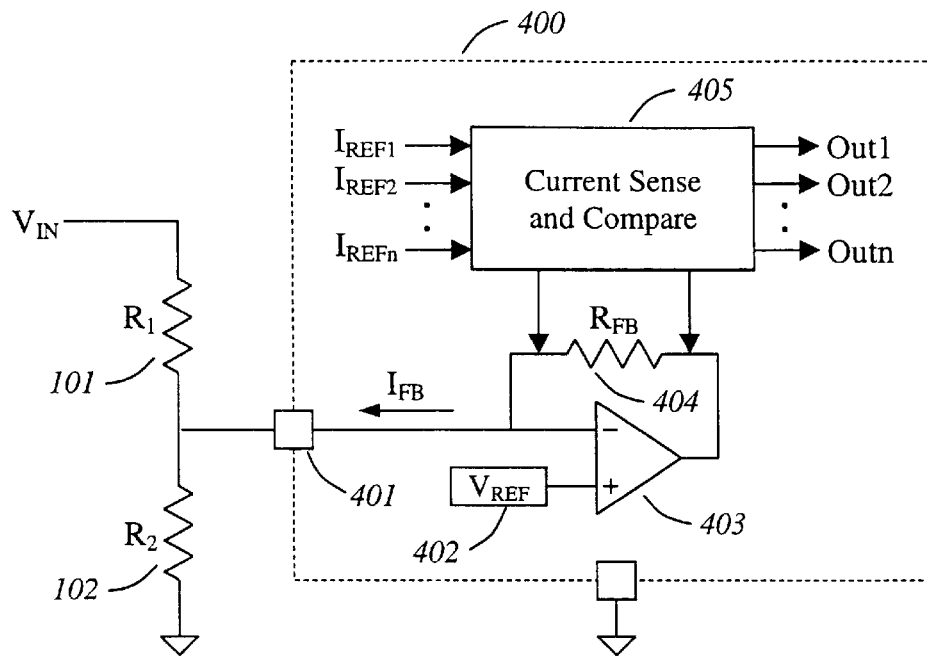
FIG. 4A is a schematic block diagram of a single-input dual-threshold voltage comparator in accordance with a first embodiment of the present invention.
Figure 4B:
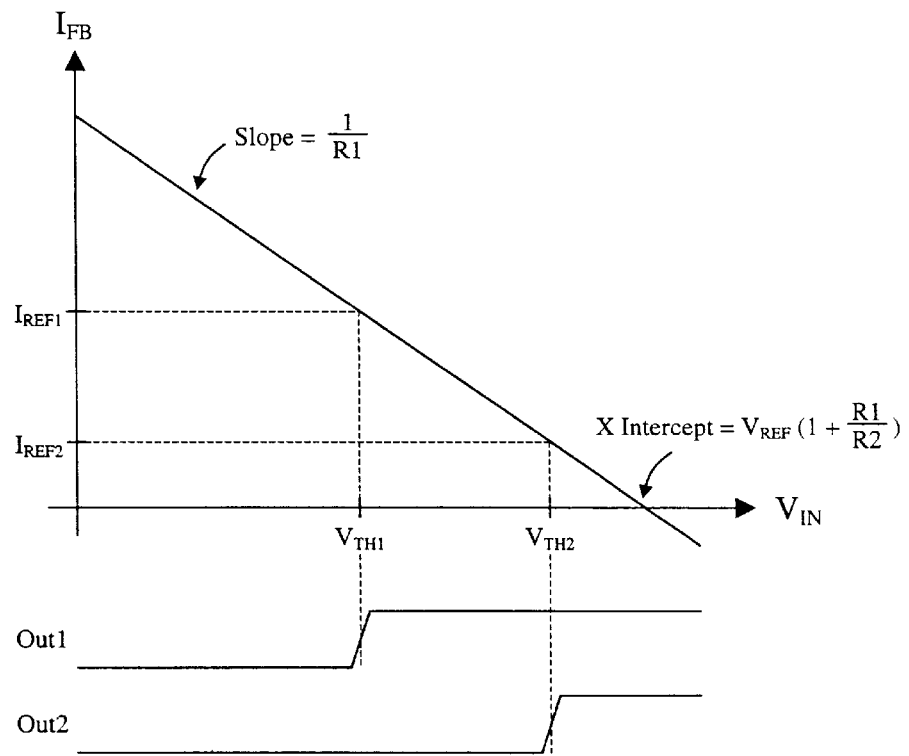
FIG. 4B illustrates waveforms of the input and output signals associated with the circuit of FIG. 4A.

Referring now to FIG. 4A, there is shown a typical application circuit in accordance with a first preferred embodiment of the present invention in which an input pin 401 of a comparator 400 is connected to an input voltage source $V_{IN}$ through an external resistor network 101, 102. Resistors 101, 102 have resistance values R1 and R2, respectively, that are dependent upon application requirements. A reference 402 provides a reference voltage $V_{REF}$ that is applied to the positive input of of a high gain amplifier 403. The negative input of amplifier 403 is connected to input pin 401. The output of amplifier 403 is connected to input pin 401 through a resistor 404. The circuitry just described implements a closed-loop active network including amplifier 403 such that the voltage at input pin 401 will be virtually equal to the voltage $V_{REF}$ generated by reference 402. A feedback current $I_{FB}$ will be a linear function of the input voltage $V_{IN}$. The transfer characteristics from $V_{IN}$ to $I_{FB}$ will be dependent upon the fixed reference $V_{REF}$ and the values of resistors 101, 102. FIG. 4B illustrates the linear relationship between the input voltage $V_{IN}$ and the feedback current $I_{FB}$. The resistance ratio R1/R2 and the absolute value of resistance R1, respectively, dictate the x-intercept and slope of the transfer characteristics illustrated in that drawing figure.

Figure 5:
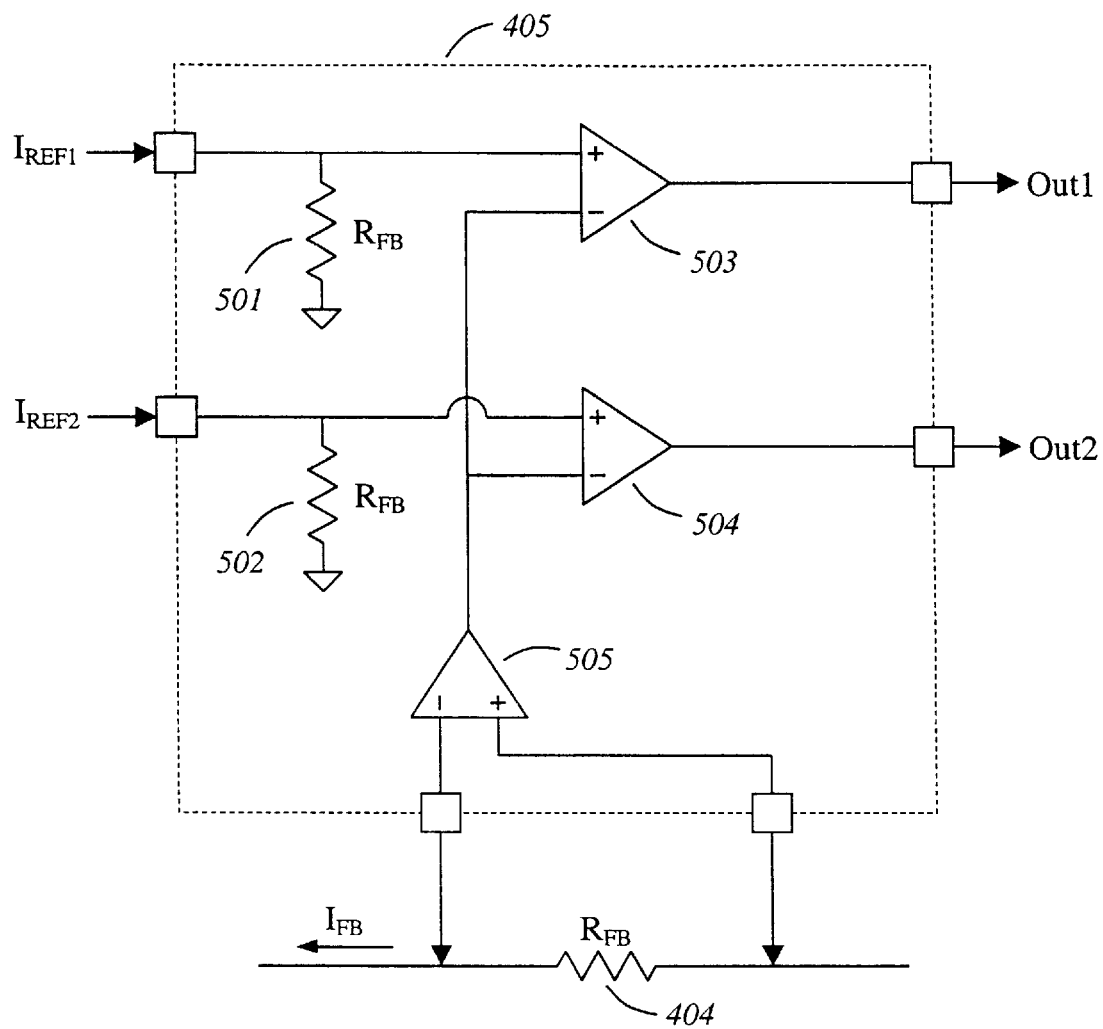
FIG. 5 is a schematic diagram of a circuit implementing the current sense and compare block of FIG. 4A.

A current sense and compare circuit 405 of FIG. 4A serves to sense and compare the feedback current $I_{FB}$ to reference currents $I_{REF1}$ and $I_{REF2}$ and to generate output signals Out1 and Out2, respectively. Any of a number of common circuit configurations for sense and compare circuit 405 may be chosen, an exemplary one of which is illustrated in FIG. 5. Reference currents $I_{REF1}$ and $I_{REF2}$ typically comprise fixed current references, but could be made variable, depending on operating conditions. Referring again to FIG. 4B, a threshold voltage $V_{TH1}$ is defined to correspond to an input voltage $V_{IN}$ that produces a feedback current $I_{FB}$ equal to the reference current $I_{REF1}$. A threshold voltage $V_{TH1}$ corresponds to an input voltage $V_{IN}$ below which the output signal Out1 will be asserted. Otherwise, the output will not be asserted. In a fashion similar to the description above with respect to threshold voltage $V_{TH1}$ a second threshold voltage $V_{TH2}$ is defined to correspond to a reference current $I_{REF2}$. Additional threshold voltages may be defined in correspondence with additional reference currents $I_{REFn}$. However, the transfer function between the reference currents $I_{REFn}$ and their corresponding threshold voltages will be linearly dependent upon the $I_{FB}/V_{IN}$ characteristics defined by the external resistor network 101, 102.

Referring now to FIG. 5, there is shown a schematic diagram of a circuit for implementing the Current Sense and Compare Circuit block 405 of FIG. 4A. The feedback current $I_{FB}$ flowing through resistor 404 will produce a voltage drop across resistor 404 equal to the product of the feedback current $I_{FB}$ and the resistive value RFB of resistor 404. The voltage drop across resistor 404 is buffered and referenced to ground utilizing differential amplifier 505. The resulting voltage at the output of differential amplifier 505 will be equal to the product of $I_{FB}$ and $R_{FB}$. The voltage ($I_{FB}*R_{FB}$) generated by differential amplifier 505 is applied to the negative inputs of voltage comparators 503 and 504.

The voltage present at the positive input of voltage comparator 503 will be generated by a reference current $I_{REF1}$ flowing into resistor 501 with a value of $R_{FB}$. The resulting voltage present at the positive input pin of voltage comparator 503 will be equal to the product of $I_{REF1}$ and $R_{FB}$. Similarly, reference current $I_{REF2}$ and resistor 502 will generate a voltage present at the positive input of voltage comparator 504 with a value equal to the product of $I_{REF2}$ and $R_{FB}$.

The output of voltage comparator 503 will be asserted when the voltage ($I_{REF1}*R_{FB}$) present on the positive input is greater than the voltage ($I_{FB}*R_{FB}$) present on the negative pin. The voltages present at both inputs of voltage comparator 503 have a common proportionality to the common resistor value $R_{FB}$ of resistors 501 and 404. Thus, it can be concluded that the output of voltage comparator 503 will be asserted when the feedback current $I_{FB}$ is less than the reference current $I_{REF1}$. Similarly, the output of voltage comparator 504 will be asserted when the feedback current $I_{FB}$ is less than the reference current $I_{REF2}$.

Figure 6A:
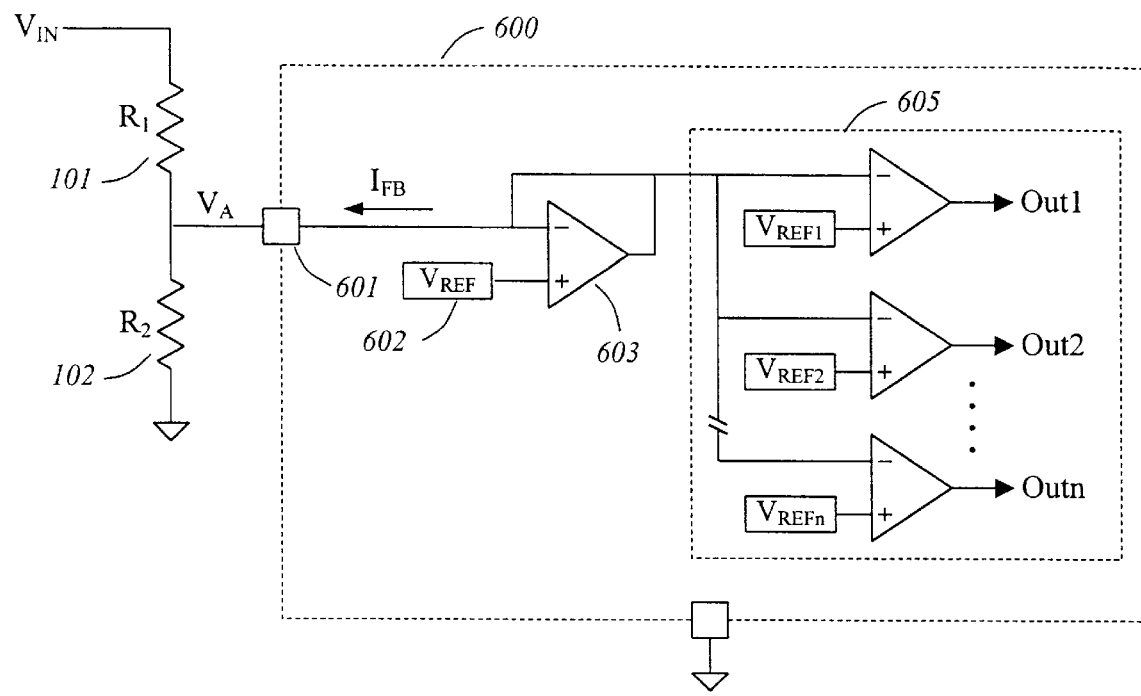
FIG. 6A is a schematic block diagram of a single-input dual-threshold voltage comparator in accordance with a second embodiment of the present invention.

Referring now to FIG. 6A, there is shown a typical application circuit in accordance with a second embodiment of the present invention in which an input pin 601 of a comparator 600 is coupled to an input voltage source $V_{IN}$ through a resistor network 101, 102. Resistors 101, 102 have resistance values R1 and R2, respectively, that are dependent upon application requirements. A reference 602 provides a reference voltage $V_{REF}$ that is applied to the positive input of of a high gain amplifier 603. The negative input of amplifier 603 is connected to input pin 601. The output of amplifier 603 provides a feedback current $I_{FB}$ to the input pin 601 such that the closed loop characterisitcs attempt to maintain a voltage at input pin 601 that is virtually equal to the voltage generated by reference 602. As in the case of the embodiment of FIG. 4A described above, the transfer characteristics between the input voltage $V_{IN}$ and the feedback current $I_{FB}$ will be dependent upon the selected values R1, R2 of resistors 101, 102.

Normally, with no limitations on the magnitude of the feedback current $I_{FB}$, the voltage on the input pin 601 will remain substantially equal to the voltage supplied by reference $V_{REF}$. By limiting the feedback current $I_{FB}$ to minimum and maximum values, the voltage on the input pin 601 can deviate from the reference voltage $V_{REF}$ when the feedback current $I_{FB}$ saturates to either the minimum or maximum values of $I_{FB}$. A voltage $V_A$ on the input pin 601 thus becomes a resistively divided version of the input voltage $V_{IN}$ exhibiting a "flat spot" when the amplifier 603 is operating in a linear region.

Figure 6B:
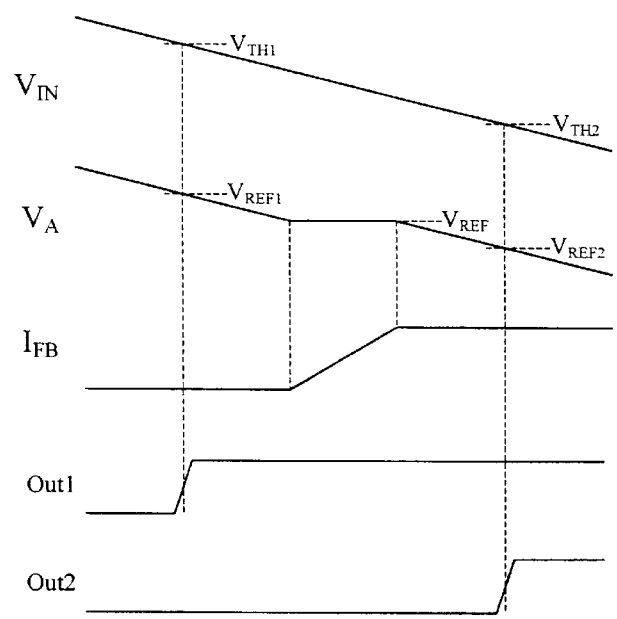
FIG. 6B illustrates waveforms of the input and output signals associated with the circuit of FIG. 6A.

Circuit block 605 serves to sense and compare the voltage $V_A$ on the input pin 601 to reference voltages $V_{REF1}$ and $V_{REF2}$ and to generate output signals Out1 and Out2. respectively. Any of a number of common sense and compare circuits may be chosen to implement circuit block 605. Referring now to FIG. 6B, a threshold voltage $V_{TH1}$ is defined to correspond to an input voltage $V_{IN}$ that produces a voltage on the input pin 601 equal to the reference voltage $V_{REF1}$. The value of the threshold voltage VTH1 will be dependent upon the selection of the values R1, R2 of resistors 101, 102, and upon the fixed references $V_{REF1}$, $V_{REF}$, and $I_{FB(MIN)}$. Similar to the foregoing description, a second threshold voltage $V_{TH2}$ is defined to correspond to reference voltage $V_{REF2}$. The threshold voltages $V_{TH1}$ and $V_{TH2}$ may be independently set by appropriate selection of the values R1, R2 of resistors 101, 102. Additional threshold voltages may be defined to correspond to additional reference voltages $V_{REFn}$, as illustrated in FIG. 6A. However, the transfer functions between the additional reference voltages $V_{REFn}$ and their corresponding threshold voltages will be linearly dependent upon a feedback current step $I_{FB}$ and the $V_A/V_{IN}$ characteristics defined by the resistors 101, 102.

Figure 7A:
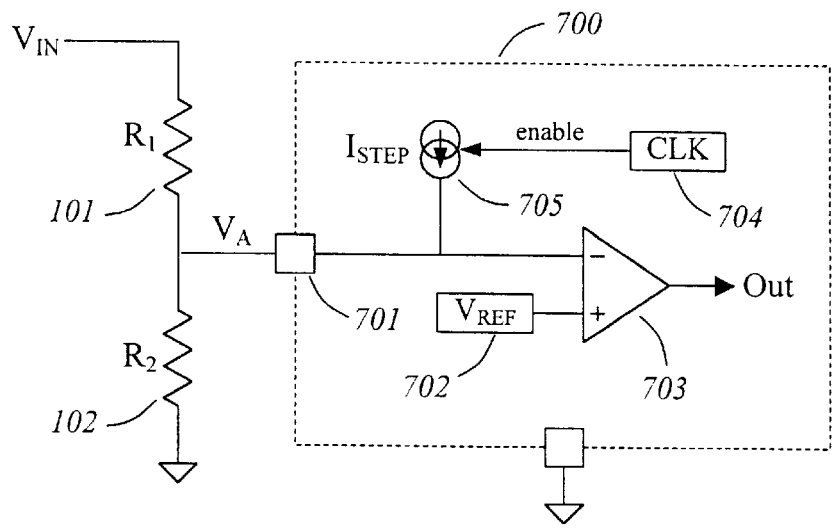
FIG. 7A is a schematic block diagram of a single-input dual-threshold voltage comparator in accordance with a third embodiment of the present invention.

Referring now to FIG. 7A, there is shown a typical application circuit in accordance with a third embodiment of the present invention in which an input pin 701 of a comparator 700 is coupled to an input voltage source $V_{IN}$ through a resistor network 101, 102. Resistors 101, 102 have resistance values R1 and R2, respectively, that are dependent upon application requirements. A reference 702 provides a reference voltage $V_{REF}$ that is applied to the positive input of a comparator 703. The negative input of comparator 703 is connected to input pin 701. An output signal Out appears at the output of comparator 703. The output of a clock circuit 704 enables a current source 705 that can be stepped between two current values, one of which is typically zero, depending upon the enable signal.

Assuming that the current provided by current source 705 is toggling between a minimum value of zero and maximum value of $I_{STEP}$, the voltage on the input pin 701 will be toggling between two values that are dependent upon the values of the external resistors 101, 102, the value of the input voltage $V_{IN}$, and the value of the step current $I_{STEP}$. The toggling voltage on the input pin 701 will have a peak voltage and a valley voltage which will shift upward and downward with changes in the input voltage $V_{IN}$. If $V_{IN}$ is sufficiently high, both the peak and valley voltages will be greater than the reference voltage $V_{REF}$ generated by reference 702. In such a state, the output of comparator 703 will always be low, as indicated by the first state of operation illustrated in FIG. 7B.

Figure 7B:
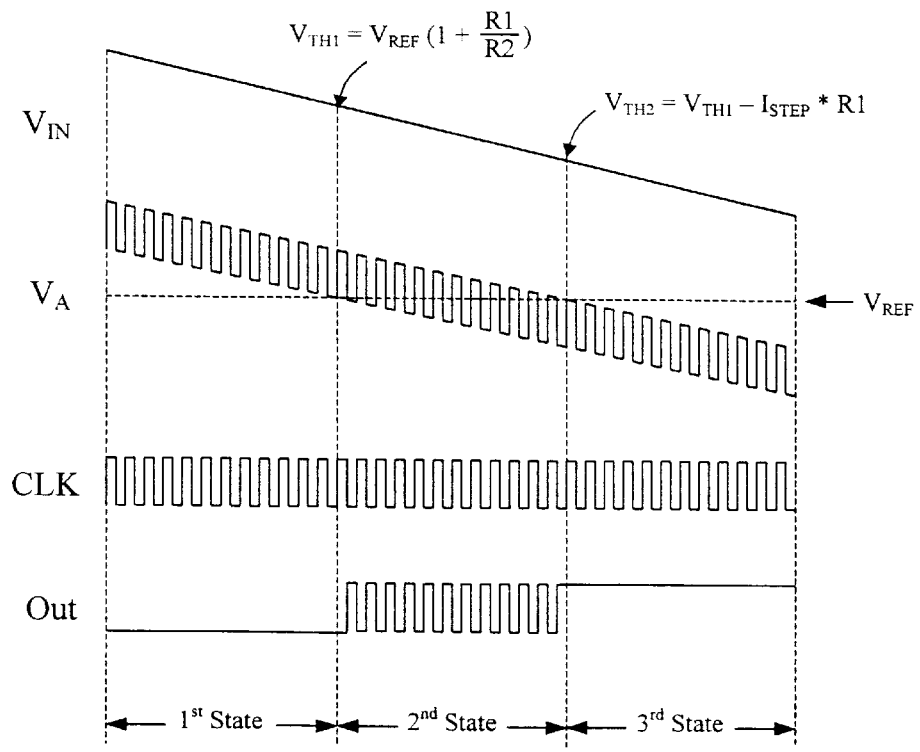
FIG. 7B illustrates waveforms of the input and output signals associated with the circuit of FIG. 7A.

As the input voltage $V_{IN}$ drops, the peak and valley voltages described above will drop proportionately. A second state of operation will exist in which the peak voltage at the input pin 701 will be greater than the reference voltage $V_{REF}$, and the valley voltage will be less than $V_{REF}$. In this second state of operation, the output of comparator 703 will be toggling at the frequency of the clock 704, as illustrated in FIG. 7B. As the input voltage $V_{IN}$ continues to drop, the peak and valley voltages will ultimately fall to a level such that both are less than the reference voltage $V_{REF}$. In this third state of operation, the output of comparator 703 will remain high, as also illustrated in FIG. 7B.

As described above, the comparator 700 of FIG. 7A illustrates three distinct states (low, pulsed, and high), corresponding to three distinct ranges of input voltage $V_{IN}$. Similar to the previously described embodiments of the present invention, the tango input thresholds at which the state transitions occur can be independently set utilizing a single resistive divider 101, 102 and input pin 701. The comparator of FIG. 7A is unique when compared to the previously described embodiments due to its ability to indicate the three distinct output states while utilizing not only a single input pin 701, but a single output pin as well.

Figure 8A:
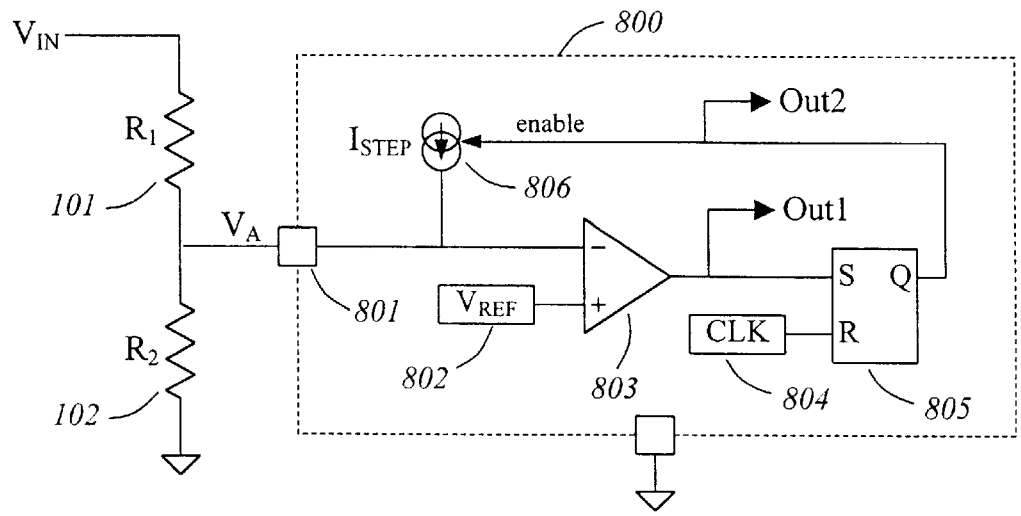
FIG. 8A is a schematic block diagram of a single-input dual-threshold voltage comparator in accordance with a fourth embodiment of the present invention.

Referring now to FIG. 8A, there is shown a typical application circuit in accordance with a fourth embodiment of the present invention in which an input pin 801 of a comparator 800 is coupled to an input voltage source $V_{IN}$ through a resistor network 101, 102. Resistors 101, 102 have resistance values R1 and R2, respectively, that are dependent upon application requirements. A reference 802 provides a reference voltage $V_{REF}$ that is applied to the positive input of a comparator 803. The negative input of comparator 803 is connected to input pin 801. The output of comparator 803, at which an output signal Out1 appears, is connected to the set input of a digital latch 805. The reset input of digital latch 805 is driven by a clock circuit 804. The output of latch 805 is connected to a current source 806 that can be stepped between two current values, one of which is typically zero, depending upon an enable signal.

When the input voltage $V_{IN}$ is relatively large, the negative input of comparator 803 will be positive with respect to the positive input of comparator 803. The output of comparator 803 will be at a steady low state. A clock pulse from clock circuit 804 will initialize the output of latch 805 to a cleared state. The clock signal generated by clock circuit 804 may be a single initiation pulse, or it may be a relatively low frequency periodic pulse. With latch 805 cleared, current source 806 will be disabled. This corresponds to the condition of the 1st state illustrated in FIG. 8B.

Figure 8B:
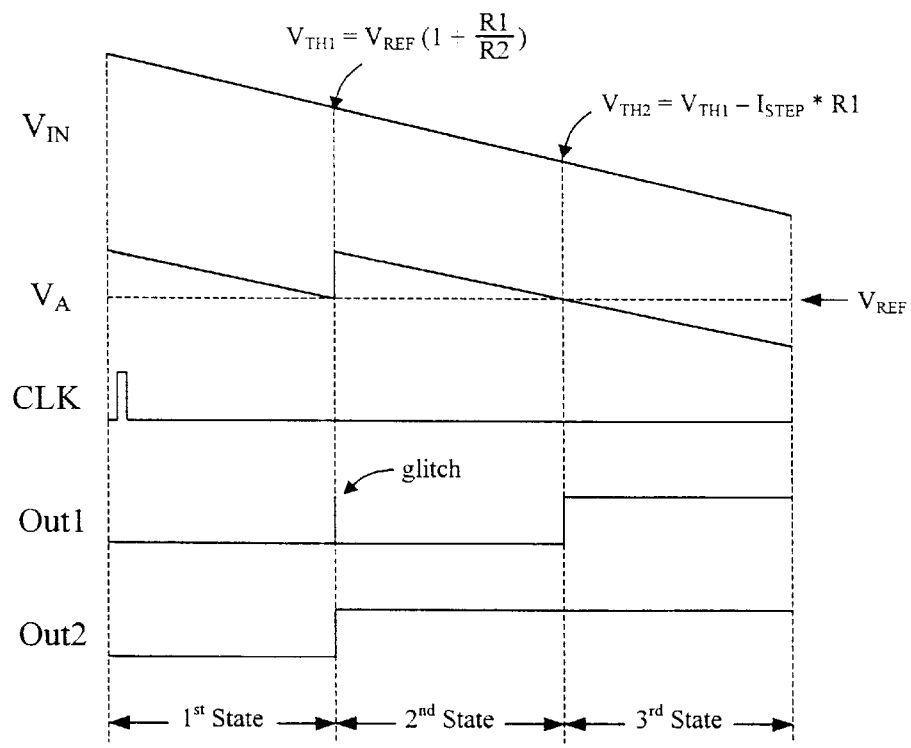
FIG. 8B illustrates waveforms of the input and output signals associated with the circuit of FIG. 8A.

As the input voltage $V_{IN}$ decays, the voltage at the negative input of comparator 803 will also decay. When the voltage at the negative input of comparator 803 is equal to the reference voltage $V_{REF}$, the output of comparator 803 will switch from a low state to a high state. With the output of clock circuit 804 at a low level, the output latch 805 will be set to a high state. Setting the output latch 805 will assert the Out2 signal and enable the current source 806. Assuming the voltage $V_A$ at the input pin 801 was previously slightly less than the reference voltage $V_{REF}$, turning on current source 806 will pull the voltage on input pin 801 above $V_{REF}$, thus forcing output signal Out1 to a low state. At the low-to-high transition of output signal Out2, a narrow glitch is present on the output signal Out1. This narrow glitch can be easily removed by well known filtering or clock synchronization. Throughout the remainder of this second state of operation, output signal Out1 will be low, and output signal Out2 will be high, as illustrated in FIG. 8B.

As the input voltage $V_{IN}$ continues to decay, the voltage at the negative input of comparator 803 will again approach the reference voltage $V_{REF}$. When the voltage at the negative input of comparator 803 falls below $V_{REF}$, output signal Out1 will transition from a low to a high state. In this third state of operation, both output signals Out1 and Out2 will be high.

Several embodiments have been described above for implementing a dual-threshold single-input voltage comparator. By using these approaches, an additional threshold level is gained over prior art comparators without the expense of an additional input pin or additional components. Although the present invention has been described with reference to specific embodiments, the descriptions are for the purpose of illustration and are not to be construed as limiting. Those skilled in the art will appreciate that the comparator of the present invention can be implemented with various modifications to the described embodiments.

I claim:

1. A comparator circuit having a single input pin connected to a source of input voltage through an external resistor network, the comparator circuit providing two or more output signals having transition points that are dependent upon said resistor network, the comparator circuit comprising:

first circuit means for generating a reference voltage;

second circuit means coupled to said first circuit means, said second circuit means comprising a closed-loop amplifier for generating a feedback current from said input pin, said second circuit means being operative for maintaining a voltage at said input pin substantially equal to said reference voltage; and third circuit means for sensing said feedback current generated by said second circuit means, for comparing said feedback current to two or more reference currents, and for responsively generating two or more corresponding output signals.

2. A comparator circuit as in claim 1, wherein said second circuit means is operative for limiting said feedback current to a minimum value.

3. A comparator circuit as in claim 1, wherein said second circuit means is operative for limiting said feedback current to a maximum value.

4. A comparator circuit as in claim 1, wherein said second circuit means is operative for limiting said feedback current to both a minimum value and a maximum value.

5. A comparator circuit having a single input pin connected to a source of input voltage through an external resistor network, the comparator circuit providing two or more output signals having transition points that are dependent upon said resistor network, the comparator circuit comprising:

first circuit means for generating a first reference voltage;

second circuit means coupled to said first circuit means, said second circuit means comprising a closed-loop amplifier for generating a feedback current from said input pin, said second circuit means including means for limiting the magnitude of said feedback current to a minimum and a maximum current, said circuit means being operative for maintaining a voltage at said input pin substantially equal to said reference voltage; and third circuit means for sensing said input voltage, for comparing a voltage at said input pin to two or more levels of additional reference voltages, and for responsively generating two or more corresponding output signals.

6. A comparator circuit having a single input pin connected to a source of input voltage through an external resistor network, the comparator circuit providing an output signal whose state is dependent upon said resistor network, the comparator circuit comprising:

first circuit means for generating a reference voltage;

second circuit means coupled to said first circuit means for comparing a voltage at said input pin to said reference voltage and for responsively generating an output signal;

third circuit means for generating a clock signal; and fourth circuit means for providing a summing current whose magnitude is a function of said clock signal and for summing a current flowing into said input pin.

7. A comparator circuit having a single input pin connected to a source of input voltage through an external resistor network, the comparator circuit providing an output signal whose state is dependent upon said resistor network, the comparator circuit comprising:

first circuit means for generating a reference voltage;

second circuit means coupled to said first circuit means for comparing a voltage at said input pin to said reference voltage and for responsively generating an output signal; and third circuit means for providing a summing current whose magnitude is a function of an externally generated clock signal and for summing a current flowing into said input pin.

8. A comparator circuit having a single input pin connected to a source of input voltage through an external resistor network, the comparator circuit providing two or more output signals having transition points that are dependent upon said resistor network, the comparator circuit comprising:

first circuit means for generating a reference voltage;

second circuit means coupled to said first circuit means for comparing a voltage at said input pin to said reference voltage and for responsively generating a first output signal;

third circuit means for generating a clock signal;

digital latch means for providing a second output signal, said digital latch means being set in response to said first output signal and being cleared in response to said clock signal; and fourth circuit means for providing a summing current having one of two values that are functions of said second output signal and for summing a current flowing into said input pin.

9. A comparator circuit as in claim 8 wherein said clock signal comprises a non-periodic pulse.

10. A comparator circuit having a single input pin connected to a source of input voltage through an external resistor network, the comparator circuit providing two or more output signals having transition points that are dependent upon said resistor network, the comparator circuit comprising:

first circuit means for generating a reference voltage;

second circuit means coupled to said first circuit means for comparing a voltage at said input pin to said reference voltage and for responsively generating a first output signal;

digital latch means for providing a second output signal, said digital latch means being set in response to said first output signal and being cleared in response to an externally generated clock signal; and third circuit means for providing a summing current having one of two values that are functions of said second output signal and for summing a current flowing into said input pin.

11. A comparator as in claim 10 wherein said externally generated clock signal comprises a non-periodic pulse.

* * * * *